(12) United States Patent
Inoue

(10) Patent No.: US 9,455,167 B2
(45) Date of Patent: Sep. 27, 2016

(54) ACCOMMODATION CASSETTE

(71) Applicant: Disco Corporation, Tokyo (JP)

(72) Inventor: Takaaki Inoue, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/515,284

(22) Filed: Oct. 15, 2014

(65) Prior Publication Data

US 2015/0027971 A1 Jan. 29, 2015

Related U.S. Application Data

(62) Division of application No. 13/926,624, filed on Jun. 25, 2013, now abandoned.

(30) Foreign Application Priority Data

Jun. 26, 2012 (JP) .................. 2012-143352

(51) Int. Cl.
  *B65D 85/00* (2006.01)
  *H01L 21/673* (2006.01)
  *H01L 23/02* (2006.01)

(52) U.S. Cl.
  CPC ....... *H01L 21/67309* (2013.01); *H01L 21/673* (2013.01); *H01L 21/6732* (2013.01); *H01L 23/02* (2013.01); *H01L 2924/0002* (2013.01)

(58) Field of Classification Search
  CPC ........... H01L 21/67309; H01L 21/673; H01L 21/6732; H01L 23/02; H01L 2924/0002; H01L 2924/00

USPC ........................ 206/711, 307.1, 308.1, 308.3
See application file for complete search history.

(56) References Cited

U.S. PATENT DOCUMENTS

| 5,507,390 A * | 4/1996 | Vila ...................... B65D 5/001 206/511 |
| 5,788,082 A | 8/1998 | Nyseth |
| 6,276,525 B1 * | 8/2001 | Kobeluch ............. A63F 9/1044 206/315.1 |
| 6,341,703 B1 * | 1/2002 | Wu ................... H01L 21/67265 206/454 |
| 6,446,806 B1 | 9/2002 | Ohori et al. |
| 7,978,279 B2 * | 7/2011 | Chung ................ B65G 49/062 206/454 |

(Continued)

FOREIGN PATENT DOCUMENTS

| JP | 07-117810 | 5/1995 |
| JP | 09-027543 | 1/1997 |

*Primary Examiner* — Nathan J Newhouse
*Assistant Examiner* — Jennifer N Zettl
(74) *Attorney, Agent, or Firm* — Greer Burns & Crain, Ltd.

(57) ABSTRACT

An accommodation cassette including: a plurality of rear accommodating grooves that are formed at least in the laterally central area of the inner surface of a rear wall connecting the rear edges of right and left side walls and extend laterally and parallel to each other at vertical spacings in such a manner as to be associated with right and left accommodating grooves.

12 Claims, 3 Drawing Sheets

(56) References Cited

U.S. PATENT DOCUMENTS

| | | | | |
|---|---|---|---|---|
| 2004/0092108 A1* | 5/2004 | Yajima | B24B 37/30 | 438/689 |
| 2004/0134828 A1* | 7/2004 | Conarro | H01L 21/67386 | 206/710 |
| 2004/0180473 A1* | 9/2004 | Kawai | B23K 26/0057 | 438/114 |
| 2006/0199355 A1* | 9/2006 | Nakamura | B23K 26/4075 | 438/464 |
| 2007/0054498 A1* | 3/2007 | Iizuka | H01L 21/6715 | 438/758 |
| 2010/0227165 A1* | 9/2010 | Maruyama | C09J 7/02 | 428/355 EN |
| 2011/0300647 A1* | 12/2011 | Jarry | H01L 21/67132 | 438/14 |
| 2012/0009763 A1* | 1/2012 | Jarry | H01L 21/67132 | 438/463 |
| 2013/0056388 A1* | 3/2013 | Nagashima | H01L 21/67383 | 206/711 |
| 2013/0095613 A1* | 4/2013 | Tanaka | H01L 21/67132 | 438/113 |
| 2013/0287528 A1 | 10/2013 | Gregerson | | |

* cited by examiner

ACCOMMODATION CASSETTE

This is a divisional of application Ser. No. 13/926,624, filed Jun. 25, 2013.

BACKGROUND OF THE INVENTION

1. Field of the Invention

The present invention relates to an accommodation cassette for accommodating a frame unit having a wafer attached thereto via an attachment tape in an opening formed at the central portion of the frame unit or directly accommodating a wafer without a frame unit.

2. Description of the Related Art

As is known to those skilled in the art, an accommodation cassette is widely used to accommodate frame units each having a wafer attached thereto via an attachment tape in an opening formed at the central portion of the frame unit or to directly accommodate wafers each without a frame unit. The cassette has two side walls, i.e., right and left side walls, provided parallel to each other with a given spacing therebetween. A plurality of right accommodating grooves are formed on the inner surface of the right side wall. The right accommodating grooves are formed at vertical spacings and extend longitudinally and parallel to each other. A plurality of left accommodating grooves are formed on the inner surface of the left side wall in such a manner as to be associated with the right accommodating grooves. The left accommodating grooves are formed at vertical spacings and extend longitudinally and parallel to each other.

According to the experience of the present inventor, however, it has been found that there is a tendency that, during manual placement of a frame unit or wafer into the above conventional accommodation cassette, a specific right accommodating groove and a left accommodating groove one above or below the groove associated with the specific right accommodating groove are erroneously selected. Placing a frame unit or wafer into the cassette with a wrong pair of right and left accommodating grooves may damage the wafer during placement of the frame unit or wafer or result in failure to extract the frame unit or wafer or damage the wafer during automatic extraction of the frame unit or wafer from the accommodation cassette by means of a wafer handling mechanism.

In order to solve the above problem with the conventional accommodation cassette, Japanese Patent Laid-Open No. Hei 7-117810 discloses easy identification of adjacent grooves of each of the right and left accommodating grooves by alternately changing the protrusion lengths or colors of the protruding pieces that define the right and left accommodating grooves on the inner surfaces of the right and left side walls of the accommodation cassette. Further, Japanese Patent Laid-Open No. Hei 9-27543 discloses easy identification of adjacent grooves of each of the right and left accommodating grooves by forming a notch at the front edge portion of every other protruding piece that defines each of the right and left accommodating grooves on the inner surfaces of the right and left side walls of the accommodation cassette.

SUMMARY OF THE INVENTION

Then, the accommodation cassettes disclosed in Japanese Patent Laid-Open Nos. Hei 7-117810 and Hei 9-27543 can comparatively easily identify adjacent grooves of each of the right and left accommodating grooves based on the protrusion length, color or presence or absence of a notch. According to the experience of the present inventor, however, these cassettes are yet to be fully satisfactory. Instead, it has been found that there is still a likelihood that a specific right accommodating groove and a left accommodating groove not associated therewith may be erroneously selected during placement of a frame unit or wafer.

Therefore, it is an object of the present invention to provide a new and improved accommodation cassette for positively preventing the selection of a wrong pair of right and left accommodating grooves during placement of a frame unit or wafer into the cassette.

In accordance with an aspect of the present invention, there is provided an accommodation cassette that includes right and left side walls, a rear wall, a plurality of right accommodating grooves, a plurality of left accommodating grooves and a plurality of rear accommodating grooves. The left side wall is provided parallel to the right side wall. The rear wall connects the rear edges of the right and left side walls. The right accommodating grooves are formed on the inner surface of the right side wall and extend longitudinally and parallel to each other at given vertical spacings. The left accommodating grooves are formed on the inner surface of the left side wall and extend longitudinally and parallel to each other at the given vertical spacings in such a manner as to be associated with the right accommodating grooves. The rear accommodating grooves are formed at least in the laterally central area of the inner surface of the rear wall and extend laterally and parallel to each other at the vertical spacings in such a manner as to be associated with the right and left accommodating grooves.

A plurality of protruding pieces should preferably be formed in the laterally central area of the inner surface of the rear wall and extend laterally and parallel to each other at vertical spacings, and the rear accommodating grooves should preferably be defined by the protruding pieces.

In the case of the accommodation cassette according to the present invention, when a specific right accommodating groove and a left accommodating groove associated therewith are correctly selected, the right and left side portions of the frame unit or wafer are inserted respectively into the right and left accommodating grooves. At the same time, the rear edge portion of the frame unit or wafer is inserted into the rear accommodating groove, thus allowing the frame unit or wafer to be placed into the accommodation cassette as required. On the other hand, if a specific right accommodating groove and a left accommodating groove one above or below the groove associated with the specific right accommodating groove are erroneously selected during placement of a frame unit or wafer, the rear edge portion of the frame unit or wafer becomes tilted relative to the rear accommodating groove, thus making it impossible to insert the rear edge portion of the frame unit or wafer into the rear accommodating groove. This leads to failure of the frame unit or wafer to be inserted rearward to the required position in the accommodation cassette, thus resulting, for example, in the front edge portion of the frame unit or wafer protruding from the front surface of the accommodation cassette. This allows the operator to recognize the fact that the right and left accommodating grooves have been erroneously selected so as to correct the selection thereof. As a result, it is possible to positively prevent the selection of a wrong pair of right and left accommodating grooves during placement of a frame unit or wafer into the cassette.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
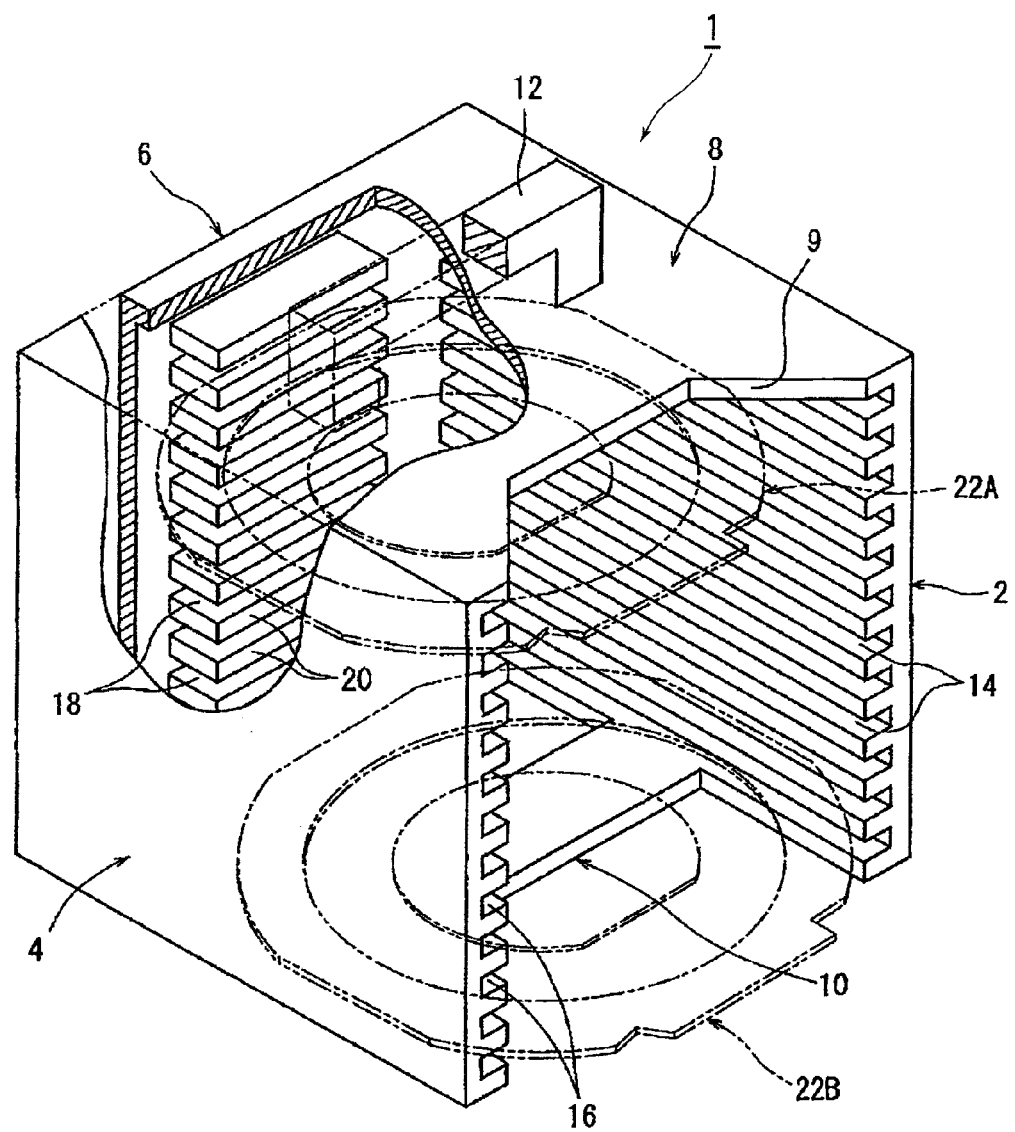
FIG. 1 is a perspective view illustrating, in a partially cut-out manner, a preferred embodiment of an accommodation cassette configured according to the present invention.
Figure 2:
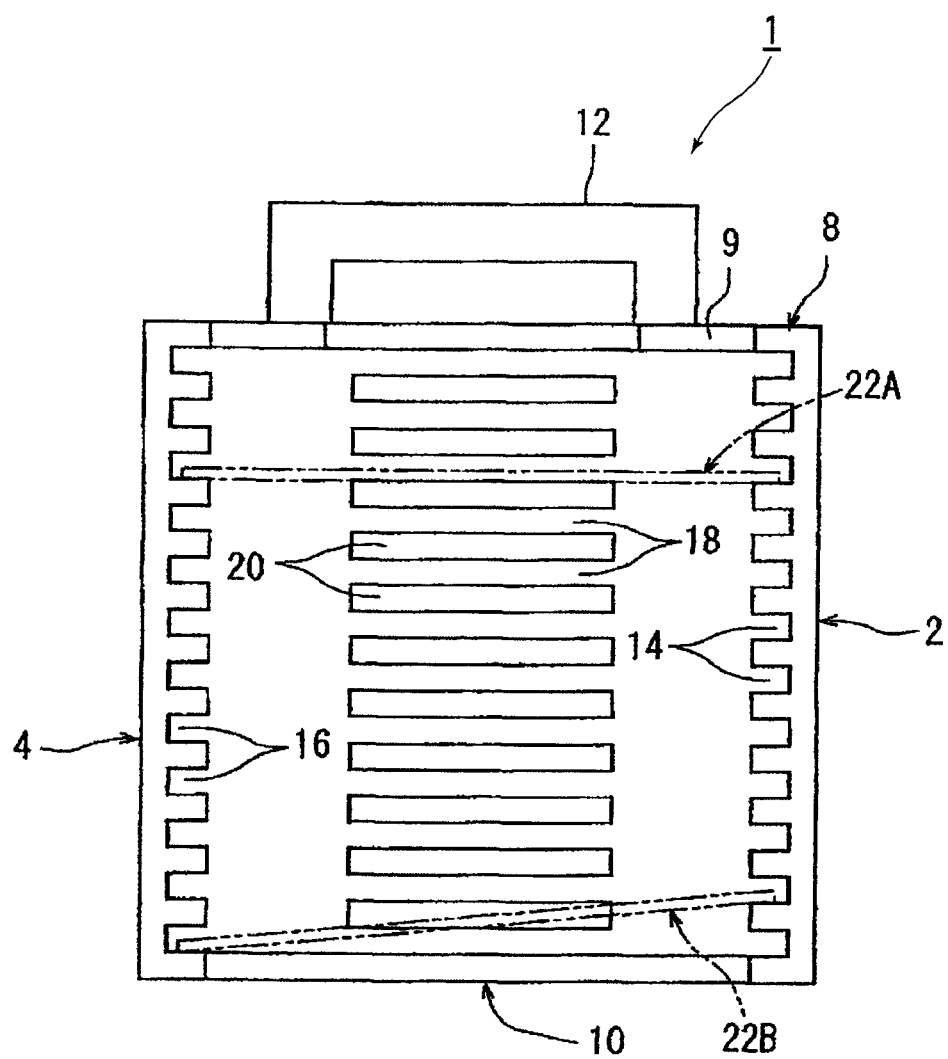
FIG. 2 is a front view of the accommodation cassette shown in FIG. 1.

A detailed description will be given below of a preferred embodiment of an accommodation cassette 1 configured according to the present invention with reference to the accompanying drawings. Referring to FIGS. 1 and 2, the accommodation cassette 1 illustrated in these figures is in the shape of a rectangular parallelepiped as a whole and has a pair of side walls, i.e., right and left side walls 2 and 4, a rear wall 6, an upper wall 8 and a lower wall 10. The right and left side walls 2 and 4 are rectangular in shape, provided at given lateral spacings and extend substantially orthogonally. The rear wall 6 connects the rear edges of the right and left side walls 2 and 4, is rectangular in shape and extends substantially orthogonally. The upper wall 8 is rectangular in shape and extends substantially horizontally. The lower wall 10 extends between the lower edges of the right and left side walls 2 and 4. In the present embodiment, the right and left side walls 2 and 4 and the rear wall 6 are rectangular in shape, with the right and left side surfaces and rear surface of the accommodation cassette 1 being completely closed. On the other hand, the upper wall 8 has a trapezoidal notch 9 formed in its front edge portion, with the upper surface of the accommodation cassette 1 being open. Further, the lower wall 10 is in the form of a belt extending substantially horizontally between the longitudinally intermediate areas of the right and left side walls 2 and 4, with the front and rear edge portions of the lower surface of the accommodation cassette 1 being open. A gate-shaped grip piece 12 is attached on the upper surface of the upper wall 8. The same piece 12 can grip the accommodation cassette 1 during transportation thereof. The entire front surface of the accommodation cassette 1 is open. The accommodation cassette 1 configured as described above can be conveniently formed by molding, in one piece, whole of the same cassette 1 with an appropriate synthetic resin or properly joining a plurality of components, each molded from an appropriate synthetic resin, together.

A plurality of parallel right accommodating grooves 14 are formed on the inner surface of the right side wall 2. The parallel right accommodating grooves 14 are formed at equal vertical spacings and extend substantially horizontally in the longitudinal direction. Similarly, a plurality of parallel left accommodating grooves 16 are formed on the inner surface of the left side wall 4 in such a manner as to be associated with the parallel right accommodating grooves 14. The parallel left accommodating grooves 16 extend substantially horizontally in the longitudinal direction. The right and left accommodating grooves 14 and 16 are provided in such a manner as to be associated with each other. The same grooves 14 and 16 are plane-symmetrical with respect to an intermediate plane extending parallel to and midway between the right and left side walls 2 and 4.

In the accommodation cassette 1 configured according to the present invention, it is important that a plurality of rear accommodating grooves 18 should be formed at least in the laterally central area of the inner surface of the rear wall 6 and extend substantially horizontally in the lateral direction at vertical spacings in such a manner as to be associated with the right and left accommodating grooves 14 and 16. In the present embodiment, a plurality of parallel protruding pieces 20 are formed in the laterally intermediate area of the rear wall 6. The same protruding pieces 20 are formed on the inner surface of the rear wall 6 and extend substantially horizontally at equal vertical spacings. Each of the rear accommodating grooves 18 is defined between the two protruding pieces 20. The vertical position and width of each of the rear accommodating grooves 18 matches those of each of the right and left accommodating grooves 14 and 16. If desired, it is possible to form the rear accommodating grooves 18 that extend laterally across the rear wall 6 rather than in the laterally central area of the rear wall 6.

Figure 3:
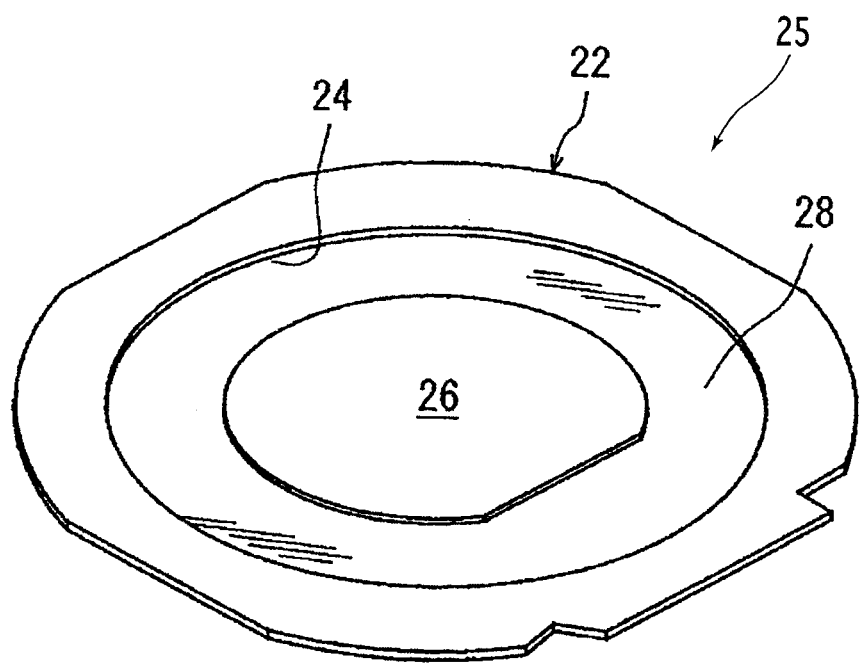
FIG. 3 is a perspective view of a typical example of a frame to which a wafer is attached.

FIG. 3 illustrates a frame 22 which is in itself a known form. The frame 22 is placed into the accommodation cassette 1 shown in FIGS. 1 and 2. A circular opening 24 is formed at the center of the frame 22 that can be formed from an appropriate synthetic resin or thin metal plate, with an approximately circular wafer 26 attached in the opening 24. Describing further in detail, a continuously extending attachment tape 28 is affixed to the rear surfaces of the frame 22 and wafer 26. The wafer 26 is attached to the frame 22 via the attachment tape 28, thus forming a frame unit 25.

As illustrated by a two-dotted line 22A in FIGS. 1 and 2, the frame unit 25 is inserted into the accommodation cassette 1 from the front surface thereof which is left open. The right side portion of the same unit 25 is placed into the specific right accommodating groove 14, the left side portion of the same unit 25 is placed into the specific left accommodating groove 16 associated with the specific right accommodating groove 14, and further, the rear edge portion of the same unit 25 is placed into the specific rear accommodating groove 18 associated with the specific right and left accommodating grooves 14 and 16, thus allowing the frame unit 25 to be placed into the accommodation cassette 1. As illustrated by a two-dotted line 22B in FIGS. 1 and 2, on the other hand, if, for example, the specific right accommodating groove 14 and the left accommodating groove 16 one below the groove associated with the specific right accommodating groove 14 are erroneously selected, the frame unit 25 is inserted into the accommodation cassette 1 with its left side tilted down. In this case, because of the insertion of the frame unit 25 into the accommodation cassette 1 in a tilted manner, it is impossible to place the rear edge portion of the frame unit 25 into the rear accommodating groove 18 formed on the rear wall 6. As a result, the front edge of the frame unit 25 is located more forward than normal as illustrated by the two-dotted line 22B in FIG. 1, thus resulting, for example, in the front edge portion of the same unit 25 protruding from the front surface of the accommodation cassette 1. Therefore, it is possible for the operator to clearly recognize the fact that the left accommodating groove 16 (or right accommodating groove 14) has been erroneously selected, thus allowing the operator to correct the selection of the left accommodating groove 16 (or right accommodating groove 14), select the appropriate left accommodating groove 16 (or right accommodating groove 14), and place the frame unit 25 into the accommodation cassette 1 as required. This positively prevents the insertion of the frame unit 25 into the accommodation cassette 1 in an inappropriate condition as a result of erroneous selection of the left accommodating groove 16 (or right accommodating groove 14), i.e., in such a manner that the frame unit 25 is laterally tilted.

A detailed description has been given above of a preferred embodiment of the accommodation cassette 1 configured according to the present invention with reference to the accompanying drawings. However, the present invention is not limited to the embodiment. Instead, there is no need to dwell on the fact that the present invention can be modified or altered in various ways without departing from the scope of the present invention. For example, while the accommodation cassette 1 for accommodating the frame unit 25 to which a wafer is attached has been described, the present invention is applicable to the accommodation cassette 1 for directly accommodating wafers each without the frame unit 25.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A combination of an accommodation cassette and at least one frame unit seated within the accommodation cassette, the combination comprising:
   the frame unit comprising a frame including a circular opening therein, an attachment tape positioned within the circular opening of the frame and a wafer attached to the attachment tape;
   the accommodation cassette comprising:
      a right side wall;
      a left side wall provided parallel to the right side wall;
      a rear wall adapted to connect the rear edges of the right and left side walls, wherein the rear wall connects to the right and left side walls at right angles;
      a plurality of right accommodating grooves that are formed on the inner surface of the right side wall and extend longitudinally and parallel to each other at vertical spacings;
      a plurality of left accommodating grooves that are formed on the inner surface of the left side wall and extend longitudinally and parallel to each other at the vertical spacings in such a manner as to be associated with the right accommodating grooves;
      a plurality of rear accommodating grooves that are formed only in the laterally central area of the inner surface of the rear wall, without extending to the right and left accommodating grooves, and that extend laterally and parallel to each other at the vertical spacings in such a manner as to be associated with the right and left accommodating grooves; and
   means for positively preventing the frame unit from being fully inserted into the accommodation cassette in a laterally tilted manner due to erroneous selection of non-aligned right and left accommodating grooves, wherein the full insertion of the accommodation cassette is defined as a situation in which a rear edge portion of the frame unit is placed in the appropriate rear accommodating groove and a front edge portion of the frame unit does not protrude past an open front surface of the accommodation cassette,
   wherein the right accommodating grooves, the left accommodating grooves, and the rear accommodating grooves are each configured and arranged to receive the frame of the frame unit,
   wherein the base of each one of the left accommodating grooves and the base of each one of the corresponding right accommodating grooves continuously extend from the open front surface of the accommodation cassette to the rear wall of the accommodation cassette, thereby defining a base plane between each pair of corresponding left and right accommodating grooves, whereby upon the full insertion of the frame unit into the accommodation cassette, the frame unit is seated upon the base plane associated with the relevant pair of corresponding left and right accommodating grooves,
   wherein the entire left side wall, including the plurality of left accommodating grooves, is integrally molded, and
   wherein the entire right side wall, including the plurality of right accommodating grooves, is integrally molded.

2. The combination of claim 1, wherein said means for positively preventing comprises a plurality of protruding pieces formed only in the laterally central area of the inner surface of the rear wall and that extend laterally and parallel to each other at vertical spacings, and further wherein the rear accommodating grooves are defined by the protruding pieces.

3. The combination of claim 1, wherein the frame comprises:
   a straight right side edge;
   a straight left side edge; and
   a straight rear edge, wherein said straight rear edge is connected to the straight right and left side edges via curved edges,
   wherein the straight right side edge of the frame is configured and arranged to be received by one of the of right accommodating grooves;
   wherein the straight left side edge of the frame is configured and arranged to be received by one of the of left accommodating grooves; and
   wherein the straight rear edge of the frame is configured and arranged to be received by one of the rear accommodating grooves.

4. The combination of claim 1, wherein the accommodation cassette further comprises:
   an upper wall that is adapted to connect the upper edges of the right side wall, the left side wall and the rear wall; and
   a lower wall that is adapted to connect the lower edges of the right side wall, and the left side wall.

5. The combination of claim 4, wherein:
   the upper wall includes a trapezoidal notch formed in a front edge portion thereof; and
   the lower wall is belt-shaped and extends between longitudinally intermediate areas of the right and left side walls.

6. The combination of claim 1, wherein the accommodation cassette is in the shape of a rectangular parallelepiped with an open front surface configured for the insertion of the frame unit.

7. The combination of claim 1, wherein the entire accommodation cassette is integrally molded from a synthetic resin.

8. The combination of claim 2, wherein faces of each of the plurality of protruding pieces are all rectangular shaped.

9. The combination of claim 2, wherein: each of the plurality of protruding pieces includes a rear planar surface facing said rear wall of said accommodation cassette; and
   said rear wall of the accommodation cassette includes an interior planar surface, wherein the protruding pieces are formed on the interior planar surface of said rear wall of the accommodation cassette.

10. The combination of claim 4, wherein the upper wall includes a notch formed in a front edge portion thereof.

11. The combination of claim 10, wherein the notch is trapezoidal in shape.

12. The combination of claim 4, wherein the lower wall is belt-shaped and extends between longitudinally intermediate areas of the right and left side walls.

\* \* \* \* \*

UNITED STATES PATENT AND TRADEMARK OFFICE
CERTIFICATE OF CORRECTION

| | |
|---|---|
| PATENT NO. | : 9,455,167 B2 |
| APPLICATION NO. | : 14/515284 |
| DATED | : September 27, 2016 |
| INVENTOR(S) | : Takaaki Inoue |

It is certified that error appears in the above-identified patent and that said Letters Patent is hereby corrected as shown below:

In the Claims

Column 6, Line 29, delete the second instance of the word "of."

Column 6, Line 32, delete the second instance of the word "of."

Signed and Sealed this
First Day of August, 2017

Joseph Matal
*Performing the Functions and Duties of the*
*Under Secretary of Commerce for Intellectual Property and*
*Director of the United States Patent and Trademark Office*